United States Patent [19]

Wang et al.

[11] Patent Number: 4,862,002
[45] Date of Patent: Aug. 29, 1989

[54] MULTIPLE CHANNEL READOUT CIRCUIT OPTIMIZED FOR A CRYOGENICALLY OPERATED IR SENSOR HEAD

[76] Inventors: Samuel C. Wang, 4798 Hyde Rd., Manlius, N.Y. 13104; David N. Ludington, #4 Briarwood, Amherst, N.H. 03031

[21] Appl. No.: 200,245

[22] Filed: May 31, 1988

[51] Int. Cl.[4] ............................ G01J 5/26; H01L 27/4
[52] U.S. Cl. ..................................... 250/352; 250/332
[58] Field of Search ...................... 250/352, 332, 334; 330/227, 295

[56] References Cited

U.S. PATENT DOCUMENTS

4,659,928 4/1987 Tew ..................................... 250/332
4,779,004 10/1988 Tew et al. ........................... 250/332

Primary Examiner—Janice A. Howell
Assistant Examiner—Richard Hanig

[57] ABSTRACT

The invention relates to a multiple channel readout circuit optimized for a cryogenically operated IR sensor head. The circuit is applicable to the individual channel preamplifiers of a charge injection device (CID) IR sensor. Since the thermal leakage must be minimized, the voltages on the principal current supply path to the individual preamplifiers will vary when a strong signal is present on any channel. Crosstalk is avoided by using a four transistor cascode preamplifier circuit having a source follower output, in which the gate of the transistor, which acts as a load to the two cascoded transistors, is isolated from the drain of the load transistor, connected to a gate load node common to the other channels, and the node connected via a single connection of high thermal impedance to a terminal external to the cryogenic environment, at which filtering may be provided as needed.

7 Claims, 4 Drawing Sheets

FIG. 1A

FIG. 1B FOCAL PLANE ARRAY

FIG. 2

FIG. 4 LINEAR ARRAY

MULTIPLE CHANNEL READOUT CIRCUIT OPTIMIZED FOR A CRYOGENICALLY OPERATED IR SENSOR HEAD

BACKGROUND OF THE INVENTION

1. Field of the Invention

The invention relates to a charge injection device (CID) for sensing infrared (IR), and more particularly to an improved readout circuit having plural readout channels optimized for a cryogenically operated IR sensor.

2. Prior Art

Infrared sensors, initially having smaller numbers of pixel sites, are now being developed with larger numbers of sites, comparable to visible light sensors. Two dimensional arrays of 128×128 and 256×256 sites are in development, as well as linear arrays having as many as 128×12, or 128×24 sites. Both large and two dimensional IR arrays and large linear IR arrays require parallel readout circuitry. Parallel readout circuitry is required both for greater speed in sampling the sites and for greater optimization of array sensitivity.

The problem presented in providing parallel readout circuitry is that of not interfering with the cryogenic environment, which is required for high performance infrared focal plane arrays, while at the same time avoiding crosstalk between parallelled channels. The focal plane array customarily combines an IR detector chip and readout circuitry. The readout circuitry is required to convert the signal obtained by sampling individual IR detector elements on the chip into a (usually) single serial signal. The signal must be amplified at each stage of the processing to a sufficiently high level to avoid noise problems in subsequent processing.

Interference with the cryogenic performance may occur if large numbers of high conductance electrical conductors leading from the cryogenic environment of the focal plane array to the warmer ambient environment are required for parallel readout. Any additional electrically conductive paths will provide additional thermally conductive paths which will add to the thermal load presented when the focal plane array is cooled. Added thermal bulk is undesirable for similar reasons.

The conventional solution to crosstalk between parallelled channels tends to compromise cryogenic efficiency. In particular, the requirements for thermal isolation make it difficult to provide Dewar penetrations of low electrical impedance that would reduce crosstalk. In addition, focal plane miniaturization prohibits adding the bulk required for effective electrical filtering on the focal plane that would reduce crosstalk. Consequently, crosstalk of the focal plane signals between channels due to voltage modulation in the power supply paths tend to be present if cryogenic efficiency is optimized.

SUMMARY OF THE INVENTION

Accordingly, it is an object of the invention to provide improved parallel readout in the focal plane array of a cryogenically operated infrared sensor.

It is another object of the invention to provide crosstalk free parallel readout without compromising thermal efficiency in the focal plane array of a cryogenically operated infrared sensor.

It is still another object of the invention to provide crosstalk free parallel readout in an IR sensor requiring a minimum increase in thermal conductance of the electrical paths.

It is a further object of the invention to provide crosstalk free parallel readout in an IR sensor requiring a minimum increase in the number and thermal conductance of the electrical paths between the cryogenic and ambient environments.

These and other objects of the invention are achieved in an IR sensor having plural readout channels, by a combination, which includes as elements, an evacuated cryogenic enclosure or Dewar apertured for the admission of IR image radiation and provided with a cold radiation shield; a thermally and electrically conductive cold finger extending into the enclosure for cooling and supporting the cold shield, and a focal plane array installed within the cold shield, and cooled by the cold finger.

The focal plane array includes an M×N plurality of IR detector elements, a multiple channel electrical readout circuit for sensing an electrical signal representing the IR image at each of (N×M) IR detector elements and grouping the sensed signals from sets of N IR detector elements into M separately scanned readout channels, and M preamplifiers, one for each set of N IR detector elements.

Each preamplifier includes four field effect transistors, three of which form a cascode amplifier, having their principal electrodes connected in series between the ground and drain nodes, both nodes being common to the M preamplifiers. The gate of the first transistor is connected to the set of N IR detector elements associated with that preamplifier. The gate of the second transistor is connected to a cascode gate node common to the M preamplifiers, and the gate of the third transistor is connected to a load gate node also common to the M preamplifiers.

The fourth transistor (T4), which forms a source follower, has its source, from which an amplified channel signal is derived, connected via a current setting resistor to the ground node, and its drain to the drain node. The gate of the fourth transistor is connected to the drain of the second transistor of the same preamplifier.

The parallel readout, in accordance with the invention, requires that electrical conductors of minimum number and cross section enter the cryogenic enclosure to operate the focal plane array, with the result that the heat loss compared to that of a single serial readout is minimized.

In particular the conductors include a first conductor for supplying the load current of the M preamplifiers, connected between the drain node and a first terminal for a first external source (VDD') of dc drain potentials, but having substantial electrical resistance (RDD) to minimize thermal conductance; a cold finger, which returns the load current of the M preamplifiers and which has negligible electrical resistance; a second conductor of minimum thermal conductance for providing a gate potential with negligible current drain for effecting cascode operation of the first and second transistors, connected between the cascode gate node of the M preamplifiers and a second terminal for a second external source of dc potentials (VGC); and a third conductor of minimum thermal conductance for providing a gate potential with negligible current drain for operating the third transistors as loads, connected between the load gate node of the M preamplifiers and a third terminal for a third external source of dc potentials (VGL).

A low ac impedance external to the enclosure and connected between the third source terminal and the cold finger is provided.

The foregoing provisions eliminate crosstalk between the preamplifiers due to signal induced voltage perturbations in spite of substantial electrical resistance in the first conductor carrying preamplifier load current.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings in which:

FIGS. 3A, 3B and 3C are circuit diagrams of three single channel preamplifiers in the readout circuitry; FIG. 3A illustrating a prior art preamplifier requiring one Dewar penetration per channel for VDD to avoid undesired interchannel crosstalk, and FIG. 3B illustrating one novel crosstalk free preamplifier, which requires only one additional Dewar penetration irrespective of the number of paralleled channels, and FIG. 3C illustrating a second crosstalk free preamplifier, suitable for a smaller number of readout channels, not requiring an additional Dewar penetration;

DESCRIPTION OF THE PREFERRED EMBODIMENTS

Figure 1A:
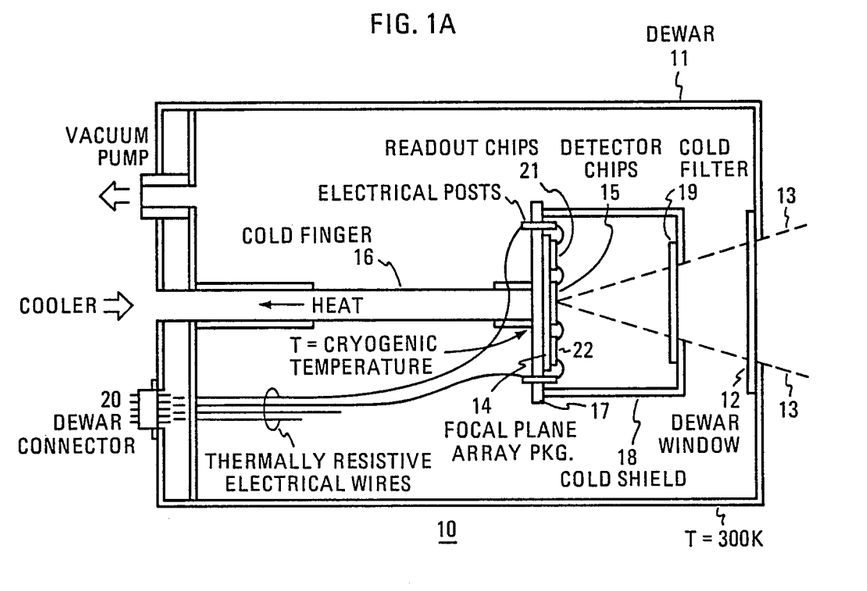
FIG. 1A is an illustration of an IR sensor head containing a focal plane array for sensing an infrared image, the focal plane array being installed within a Dewar and cooled through a cold finger.

Referring now to FIG. 1A, an IR sensor head 10, to which the invention has application, is shown. The sensor head comprises a deep cylindrical enclosure or Dewar 11, suitable, when evacuated, to provide a low temperature environment with low heat loss for the focal plane array 14 of which the IR detector chip 15 is a major part. The detector chip is an array of IR detector elements. The Dewar 11 has an IR transparent window 12 hermetically sealed to the enclosure for the admission of IR radiation. The IR radiation impinges on the IR detector chip 15 over an aperture 13, defined from the viewpoint of the IR detector chip, by the edges of the window 12. The walls of the Dewar are typically at an ambient temperature of 300° K while the IR detector requires an operating temperature of from 20° K. to 120° K., depending upon wavelength, for sensitive performance.

The measures which facilitate low temperature operation of the IR detector include both cooling and minimizing heat leakage from the higher temperature environment. The cooling is provided by a thermally and electrically conductive "cold finger" 16, 17. The cold finger includes an elongated tubular post 16 which has thin walls, thickened as it enters the Dewar and at the inner end. The cold finger extends inwardly from the back of the enclosure toward the aperture 12, terminating in a thermally substantial end plate 17 facing the aperture 12. The end plate of the cold finger both supports the substrate 14 of the focal plane array in front of the Dewar window and facilitates cryoenic operation by distributing the cooling over the focal plane array.

The active cooling or "refrigeration" may take several forms, each of which tends to become less efficient as the operating temperature falls. The ideal Carnot cycle efficiency, is the ratio of the operating temperature to the ambient, which for a 77° Kelvin operating temperature and a 300° K. ambient gives an ideal Carnot efficiency of only 25%.

Available coolers in these temperature ranges cannot approach Carnot cycle efficiency but rather exhibit efficiencies of a few percent, typically from 3 to 7 percent. Two kinds of coolers suitable to this application use the Joule-Thompson effect and the Sterling Cycle, respectively. Both approaches may be used to provide a few watts of cooling power over a small surface in the Dewar enclosure, and do so as a consequence of a much larger energy expenditure. The ideal design places the cooling at the end of the cold finger in good thermal contact with the end plate 17.

The cold finger is designed to provide rigid support of the focal plane array and good thermal efficiency in achieving the desired operating temperature for the IR detector 15. The walls of the tubular column of the cold finger are made relatively long and thin to minimize conductive heat leakage from the warm environment at the base of the tubular column to the cooled interim and the ends of the column are thickened to provide good mechanical support for the column in relation to the Dewar and good mechanical support for the end plate and focal plane array in relation to the column.

The thickened end plate 17 also provides a conductive cooling path for a cylindrical cold shield 18 which intercepts thermal radiation from the warm walls of the Dewar and prevents it from impinging on the IR detector. The cold shield is itself thickened for good heat conduction. It is attached to the end plate 17 and is cylindrical, encircling the focal plane array. The cold shield 18 is appertured adjacent the window 12 in the Dewar, and an IR transmissive window 19 maintained at a cold temperature by conductive contact with the cold shield, covers the opening in the cold shield. The window 19 in the cold shield admits IR radiation over the same aperture 13 as the window 12 in the Dewar.

The foregoing thermal arrangement is designed to minimize heat transfer from the high temperature environment external to the Dewar to the focal plane array. Any such heat transfer tends to raise the array temperature above the desired low operating temperature (e.g. 77° K.) and to increase the thermal load on the refrigerator. Maintenance of a good vacuum prevents any substantial convective heat transfer due to gas between the warm walls of the Dewar and the IR detector. The cold shield surrounding the focal plane array which is cooled by the cold finger to approximate the temperature of the IR detector, prevents the absorption by the IR detector of radiative heat from the warmer walls of the Dewar, and the cold shield is itself, designed to minimize the thermal load. The admission of IR radiation through the windows 19 and 12 in the cold shield and in the Dewar respectively is preferably limited to only the spectral range and aperture of interest. Thus the design of the apertures and windows also minimizes the admission of undesired IR radiation, minimizing heat leakage and thereby the thermal load on the refrigerator.

A remaining and substantial source of heat leakage from the exterior of the Dewar to the focal plane array are the electrical connections. When the refrigerating efficiency is only a few percent, and the provision of power to the refrigerator expensive, the heat losses in the electrical connections become significant and require minimization.

As shown in FIG. 1A, the electrical connections to the focal plane 14 consist of a bundle of relatively long wires leading to the connector 20 at the base of the Dewar. The electrical connections may, in a minimum sized array, be as few as ten. On the other hand, in a large array requiring a plurality of parallel output channels, the number of connections may triple or quadruple in a linear array, or increase by the number of columns in an area array (e.g. 256).

Figure 1B:
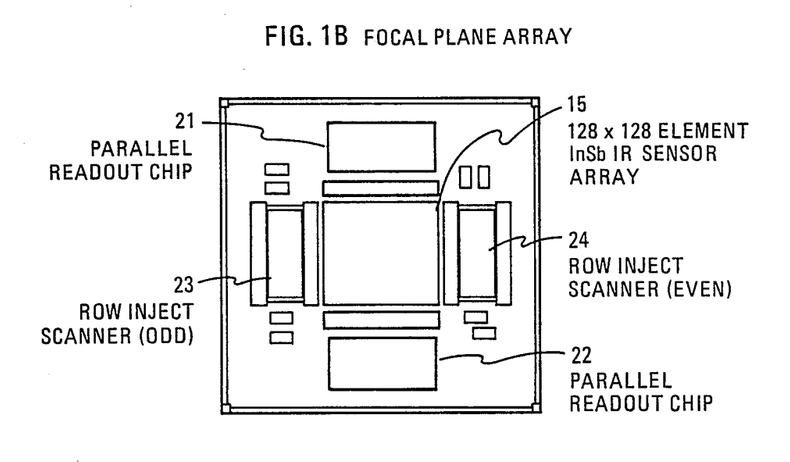
FIG. 1B is a plan view of the focal plane array which combines an IR detector array with other integrated circuits providing crosstalk free parallel readout.

The electrical elements on the focal plane array requiring electrical connections are illustrated in FIG. 1B. The IR detector chip 15 is disposed in the center of the array while a pair of parallel readout ICs 21 and 22 are provided above and below the IR detector chip, and a pair of scanners 23 and 24 are provided to the right and to the left of the IR detector chip.

Figure 2:
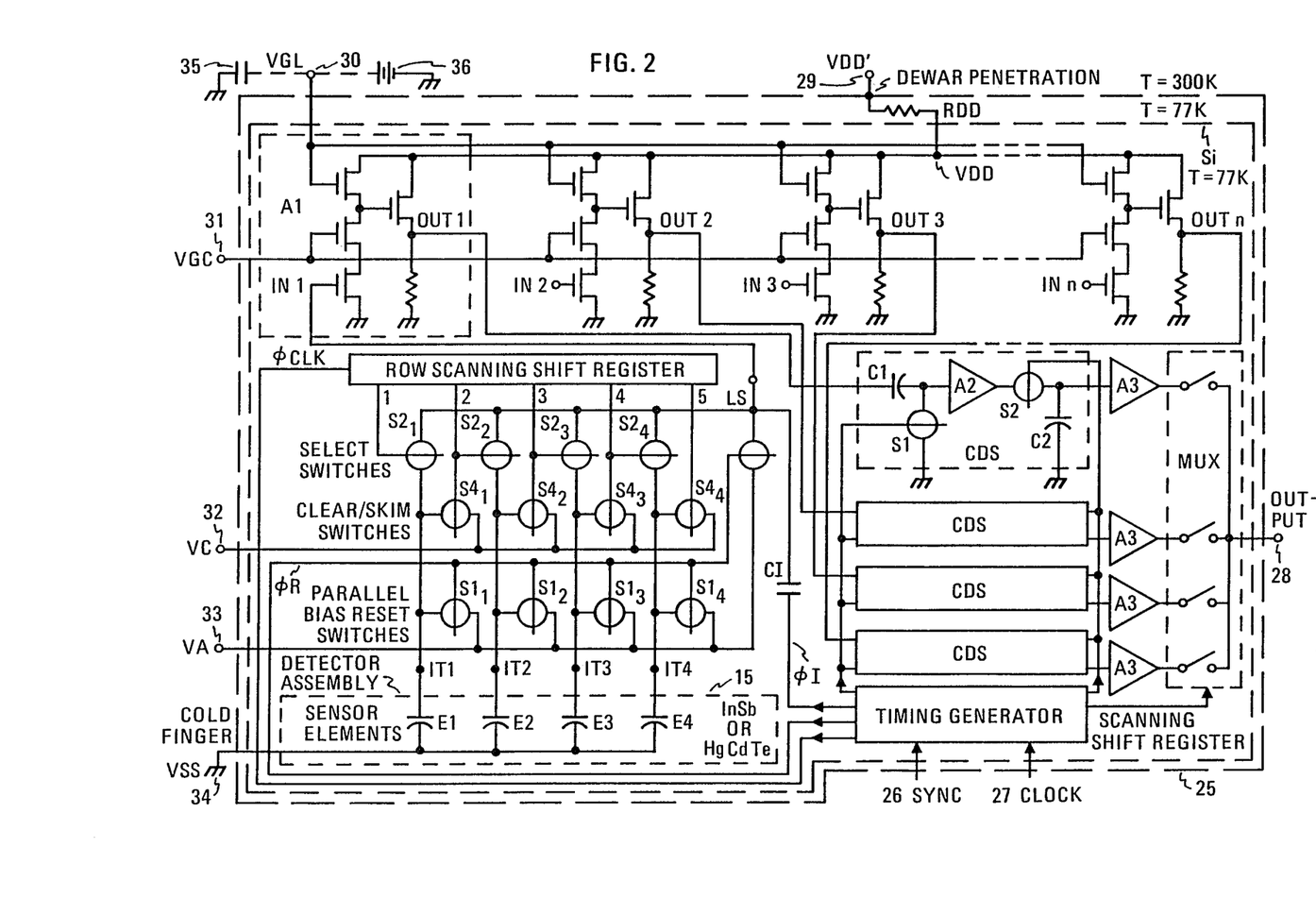
FIG. 2 is an electrical circuit diagram of the focal plane array illustrating a portion of the IR detector array and readout integrated circuits sharing a common ceramic substrate, the IR detector elements of one row of the detector array being shown with the scanning register for that row and with the novel crosstalk free parallel readout circuit for that row and three additional rows.

The connections, which the foregoing array circuits require, are illustrated in FIG. 2. The boundaries of the vacuum system corresponding to the walls of the Dewar are illustrated by the dashed line 25 which surrounds the illustrated circuitry. The electrical connections which must pass through the Dewar, and which while providing an electrical path also provide an undesired thermal conduction path, are shown crossing the dashed line 25. Commencing counterclockwise from the bottom, the electrical connections include synchronization (26) and clock connections (27), the multiplexed signal output (28) of the IR sensor head, the connection (29) to the external source of drain voltage VDD′, an external gate load connection VGL (30), a cascode voltage connection VGC (31), and three connections including (VC) 32, (VA) 33 and the ground connection (VSS) 34 (provided by the cold finger itself) for sampling the IR detector sites.

The circuit of the focal plane array is illustrated in FIG. 2. The function of the circuit is to convert the image data received by the individual IR detectors on the chip 15 into a serial sequence of electrical signals representative of the image and at a sufficiently high level for noise immunity as the video signal is further processed. Accordingly, the focal plane array includes the Indium Antimonide (InSb) or Mercury Cadmium Telluride (HgCdTe) chip 15, on which the IR detectors are formed, and which is connected to sequential site selection circuitry. The site selection circuitry includes a row scanning shift register and a matrix of select switches, clear/skim switches and parallel bias reset switches which deliver a column output signal on the sensing line (LS) for each column. The output signal from each column sensing line is amplified by a cascode connected column preamplifier (A1). The output of preamplifier A1 is then connected to the video processor for the selected column, which consists of a correlated double sampling circuit (CDS). The output of the sampling circuit for each column with additional amplification (A2, A3) is coupled to a multiplexer (MUX) which connects the successive column output to a conventionally singular video output terminal 28. The electrical paths, which must pass through the Dewar, are thus used for sequential site selection, for video processing and multiplexing, and for energizing the preamplifiers.

The preamplifier energization connections are potentially the most critical, depending upon the number of parallel channels, in that the required connections for crosstalk free operation may become undesirably large and present an undesirably large number of Dewar penetrations and an undesirably large thermal load. The problem of avoiding crosstalk, while at the same time minimizing the heat load in a large focal plane array, may best be understood by reference to FIGS. 3A, 3B and 3C.

Figures 3A, 3B, 3C:
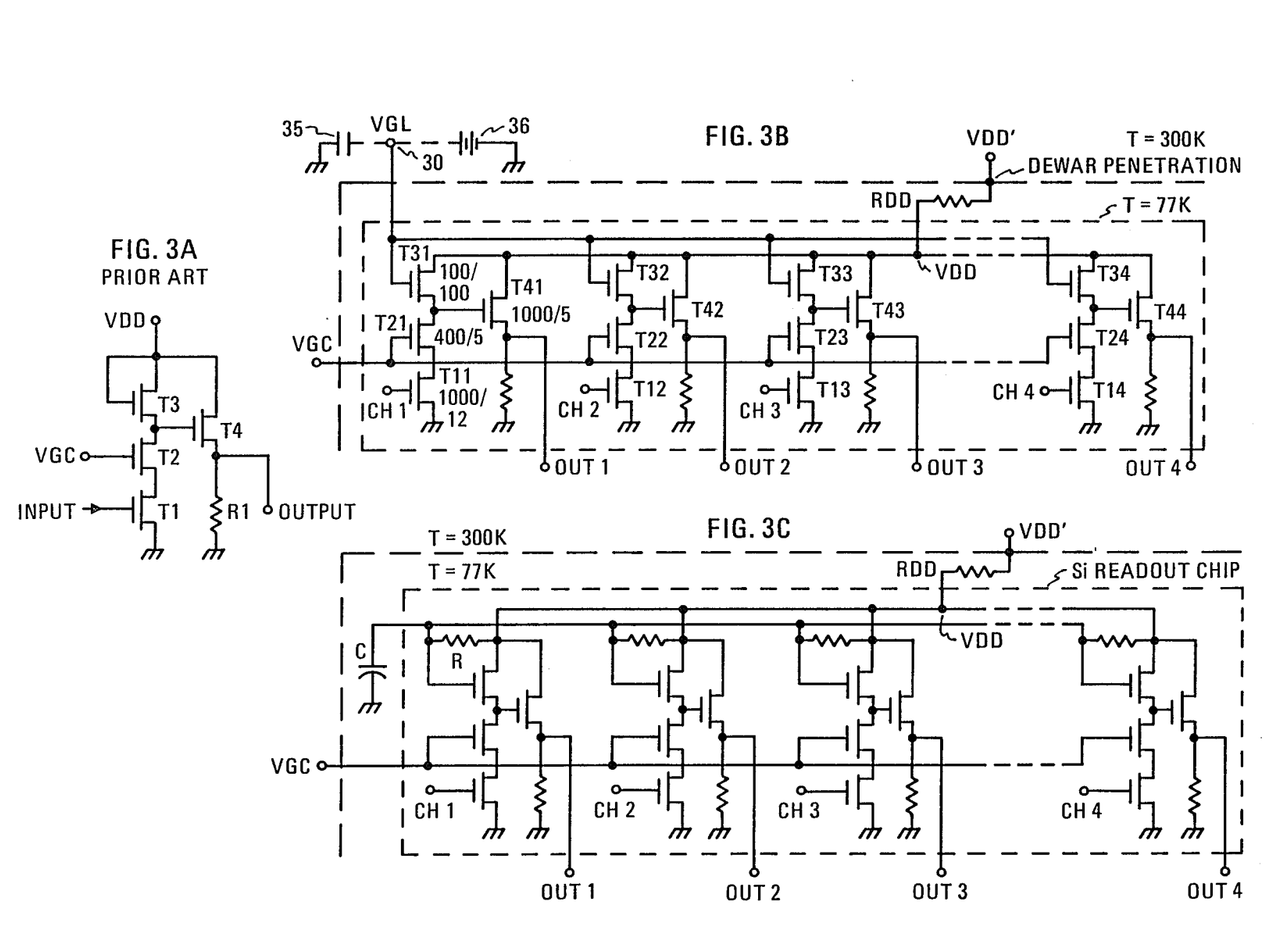

FIG. 3A shows a typical preamplifier circuit conventionally used in the readout chip for an infrared CID focal plane array. The amplification circuit consists of four MOSFET transistors each having a gate and as principal electrodes a source and drain. Three (T1, T2 and T3) of the four field effect transistors form a cascoded amplifier stage having their principal electrodes connected in series between a ground node (VSS) and an internal drain node (VDD). The first transistor T1 has its source connected to the ground node (VSS) and its gate connected to a column sensing line (LS) from the IR detector array. The second transistor T2 with its source connected to the drain of the first transistor, has its gate connected to an external source (VGC) of DC potentials. The third transistor T3, which provides a load to the first and second transistors, has its gate connected to a second source (VDD) of DC potentials. The preamplifier circuit is completed by a fourth transistor T4 forming a source follower output stage. The source of transistor T4, from which the output of the preamplifier is taken, is connected via a current setting resistor R1 (typically 10K ohms) to the ground node (VSS) and the drain of transistor T4 is connected to the internal node VDD. The drain node VDD thus becomes the common point of connection for the drains of both the third and fourth transistors. The gate of the fourth transistor is connected to the connection between the drain of the second transistor and the source of the third transistor.

When the foregoing preamplifier is to be used in a multiple channel implementation, a conventional implementation would be to tie all the drain nodes together to a single point (node D) from which connection to an external power supply VDD′ may be provided by a wire (RDD) of low thermal conductivity. The use of a low thermal conductivity wire, which connects the readout chip at cryogenic temperatures via a Dewar penetrating connection at the ambient temperature (300° K.) is necessary in order to satisfy the thermal load requirements of the focal plane array. Unfortunately, the thermal conductance and the electrical conductance of the wire are mutually proportional. For example, a wire of 8 mil diameter copper phosphor alloy with polyimide insulation conducts approximately 4.3 milliwatts of heat over a path six inches long and has an electrical resistance of 1 ohm per foot. A 2.5 mil diameter wire of the same alloy and of the same length conducts approximately 0.42 milliwatts of heat while exhibiting an electrical resistance of 10 ohms.

In a practical circuit, a series resistance of 10 ohms can cause serious signal crosstalk between the channels during readout. (Similar series resistances apply to other Dewar connections except that they do not cause any adverse effect on electrical circuit performance. The ground connection to VSS uses the electrical conduction of the cold finger, which is very good and of negligible resistance.) Specifically, a large signal on any channel will result in a voltage modulation delta V at node D where delta V=delta IS X RDD.

This modulation is not easily filtered out at the focal plane array due to constraints of space within the Dewar. The voltage modulation from one channel with a strong signal is coupled via the common connection to node VDD to each channel resulting in an undesired signal in each channel. The amount of crosstalk to the other channels is proportional to the series resistance RDD. Accordingly if the RDD can be made very small in a hypothetical case, and filtering provided outside the Dewar at the node VDD', the crosstalk would be removed. However, the heat loss would be intolerable, preventing the hypothetical solution from becoming a practical solution.

A second hypothetical method of eliminating crosstalk would be to use a separate wire of low thermal conductivity for each channel as it passes through the Dewar, and, at a point external to the Dewar providing the necessary filtering to eliminate the crosstalk. Unfortunately, the alternative of large numbers of Dewar penetrations represent both an expensive and thermally inefficient solution to the crosstalk problem. An alternative which avoids both unreasonable heat loss and the crosstalk problem, and which requires only a single additional Dewar penetration over a single channel readout is illustrated in FIG. 3B. (The modified preamplifier configuration of FIG. 3B is like that illustrated in FIG. 2.)

The crosstalk problem in the conventional preamplifier may be explained with reference to FIG. 3A. As will be shown, interchannel crosstalk may be explained as due to modulation of the VDD voltage on a first channel amplifier, in particular the transistor T31 (the subscript T31 denoting the third transistor in the first channel) of the first channel from a strong IR flux coupled to a IR detector supplying a signal to a second channel preamplifier. The strong IR flux detected by an IR detector supplying a signal to the second channel produces a voltage drop at the signal gate of the transistor T12. The resulting output of the inverting cascode amplifier (T12, T22) yields an increase in voltage at the gate of transistor T42. The output stage T42, however, due to a large (e.g. 10K) source impedance, draws a substantially constant current and thus produces no significant change in the current drawn from the VDD bus. However, the decrease in voltage at the input gate of transistor T12 produces a significant decrease in current in transistor T32, T22 and T12 (as a function of the transconductance GM of the input transistor T12). This decrease in current produces a decrease in the voltage drop in the resistance RDD connecting the internal VDD bus to the external VDD' bus, and an increase in the voltage on the internal VDD bus feeding the first channel preamplifier.

The resulting increase in voltage on the VDD bus produces a modulation of the output of the first channel preamplifier corresponding to a strong IR flux in the following manner. Assuming an increase in the voltage on the drain of the transistor T31, an increase in voltage is also produced on the gate of transistor T31, since they are connected together. Transistor T31 thus becomes a virtual source follower, because the series impedance of the cascode stage T11, T21 is high, and near unity voltage gain may be expected due to source follower action in the voltage transfer to the source of transistor T31. An increase in voltage on the gate of the transistor T31, accordingly produces an increase in the voltage on the source of transistor T31, and a corresponding increase in the voltage on the gate of the transistor T41 connected to the T41 source. Thus an increase in the output voltage of the source of transistor T41 occurs, giving the appearance of a signal flux at the input of the preamplifier.

In order to avoid worsening preamplifier performance by parallelling channels, the immunity to crosstalk should be on the same order as temporal noise. This prevents the paralleling from worsening the signal to noise ratio. In a practical example, a preamplifier input voltage at the preamplifier corresponding to a maximum IR flux signal is 0.2 volts and a maximum current drop of 0.725 milliamps is produced. The output voltage at the source follower of 1.7 volts corresponds to a voltage gain of 8.5 through the preamplifier. A temporal noise figure of 50 microvolts would suggest that the maximum perturbation on the VDD bus due to interchannel crosstalk should be no greater than 50 microvolts. This would indicate that RDD should be less than 0.07 ohms, which is impractical from the heat loss standpoint.

The preamplifier may, however, be modified, in accordance with the invention, by altering the gate connection of the cascode load transistor as illustrated in FIG. 3B. In order to avoid interchannel crosstalk, the gates of the third transistor (T3) in all of the preamplifiers are connected to a common gate load "node", and the node is connected by a conductor of minimum thermal conductance (which penetrates the Dewar at 30) to a "stiff" low impedance voltage source 36 (VGL) external to the Dewar. Optionally an external capacitor 35 may be used to provide greater voltage stability at the node against short duration IR detector signals.

The resistances of the conductors of minimum thermal conductance connected to the gate nodes (VGL or VGC) is a matter of no concern, since either single gates or multiple gates draw very little current, and thus produce negligible voltage perturbation. Thus with negligible current flow a single, relatively high electrical resistance/low thermal conductance connection at 30 stabilizes the voltage on the gates of the load transistors (T3), and precludes source follower action or any other second order effect which might cause interchannel crosstalk. Since the output of each cascode amplifier is now immune to crosstalk, the load of the cascode amplifier produces a signal representative only of the IR flux signal at the input of the first transistor (T1).

The transistors in each preamplifier are operated with VSS=0; VGC=+4 volts; and VGL, VDD and VDD' at (nominally) +8 volts. The external sources are normally of low impedance at the frequencies of IR detector signals. Filter capacity may also be added at these connections.

As indicated above, the preamplifiers for the paralleled channels require only four external connections, the VDD connection which must carry all the preamplifier currents, and so may not have insignificant thermal conductance; the two connections to two gate nodes VGC and VGL, which may be of minimum thermal conductance consistent with the mechanical and electrical integrity of the connections; and the fourth electrical conduction path provided by the cold finger, whose presence is required for other reasons. Only one connection, the VGL connection, must be added to accommodate parallel channel operation.

The measured electrical isolation, using the geometry illustrated in FIG. 3B is approximately 60 db. This circuit change thus reduces the thermal leakage in a large array requiring a large number of parallelled output stages to a value approximately the same (within about 10%) as for a small array not requiring parallelled outputs.

An alternative embodiment of the invention is illustrated in FIG. 3C. The method of FIG. 3C has primary application to small linear arrays (128×12) where a small chip capacitor can provide an adequate time constant. Here a dc path of high resistance (R=100K ohms) on the Si chips may be provided connecting the gate of each transistor T3 to its drain. The gates are then collectively connected to a miniature chip capacitor of a capacitance of 22,000 pf mounted on the focal plane hybrid package. The capacitance and resistance establish a long time constant, while also providing immunity on each channel to crosstalk.

Figure 4:
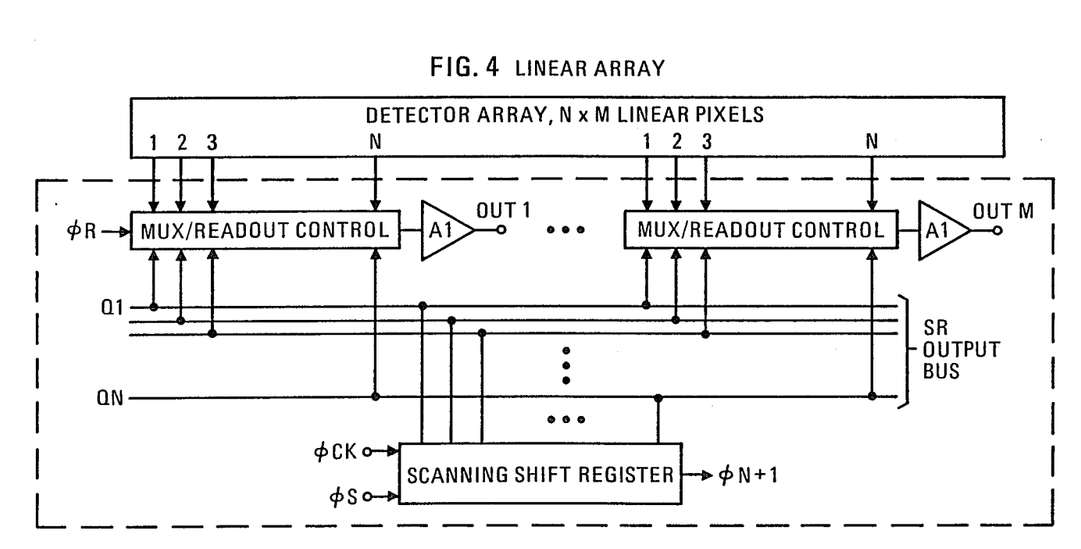
FIG. 4 is a simplified electrical block diagram of the parallel readout in a linear focal plane array.

FIG. 4 is a block diagram showing the application of crosstalk free parallel readout to a linear array. In long linear arrays assembled from more than one chip, the number of channels may be increased as required for the application.

Figure 5A:
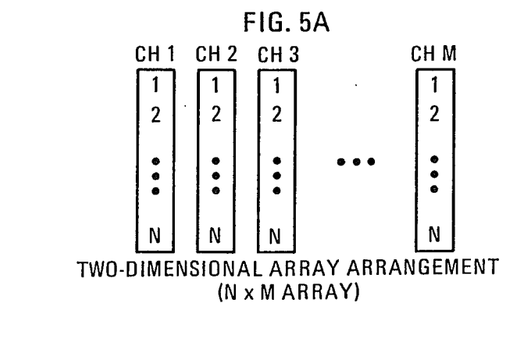
FIGS. 5A and 5B are block representations of the parallel readout process in an area array and in a linear array respectively.
Figure 5B:
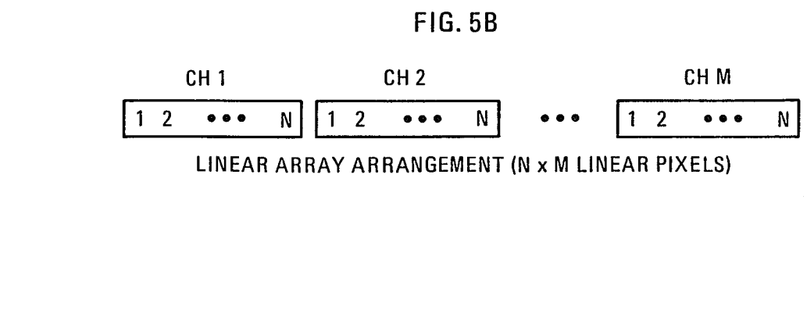

FIGS. 5A and 5B are block diagrams representing the readout process respectively in a two dimensional array and in a linear array. In the two dimensional array, the channels are naturally one per column for optimum sensitivity. Current two dimensional arrays have 128×128 and 256×256 pixels.

What is claimed is:

1. In an IR sensor having plural readout channels, the combination comprising
   (1) an evacuated cryogenic enclosure having an aperture for admission of IR image radiation through a predetermined aperture, and a cold radiation shield within said enclosure and spaced from the walls thereof,
   (2) a thermally and electrically conductive cold finger extending into said enclosure for conductively cooling and mechanically supporting said cold radiation shield,
   (3) a focal plane array installed within said cold radiation shield, mechanically supported by, electrically grounded to, and conductively cooled by said cold finger, including
      (a) an M×N plurality of IR detector elements for intercepting said IR image radiation within said aperture,
      (b) a multiple channel electrical readout circuit for sensing an electrical signal representing the IR image at each of (N×M) IR detector elements and grouping said sensed signals from sets of N IR detector elements into M separately scanned readout channels to facilitate a higher scanning rate and/or higher signal to noise ratio, and
      (c) M preamplifiers, one for each set of N IR detector elements, each preamplifier including four field effect transistors (T1-T4), each transistor having a gate and as principal electrodes, a source and drain;
         three field effect transistors (T1-T3) forming a cascoded amplifier having their principal electrodes connected in series between a ground node (VSS) and a drain node (VDD), both nodes being common to said M preamplifiers,
         the first transistor (T1), with source connected to said ground node (VSS), having the gate thereof connected to the set of N IR detector elements associated with that preamplifier,
         the second transistor (T2), with source connected to the drain of the first transistor, having the gate thereof connected to a cascode gate node common to said M preamplifiers,
         the third transistor (T3), with the source connected to the drain of the second transistor having the gate thereof connected to a load gate node common to said M preamplifiers, and
         the fourth transistor (T4) forming a source follower, the source of which is connected via a current setting resistor to said ground node (VSS), the drain of which is connected to said drain node (VDD), and the gate of which is connected to the drain of the second transistor of the same preamplifier, and
   (4) electrical conductors of minimum number and cross sectional area entering said cryogenic enclosure for operating said focal plane array with minimum heat loss, comprising,
      (a) a first conductor for supplying the load current of said M preamplifiers, connected between said drain node and a first terminal for a first external source (VDD') of dc drain potential, and having substantial electrical resistance (RDD) to minimize thermal conductance,
      (b) said cold finger, which returns the load current of said M preamplifiers, being electrically connected between said ground node and an external ground terminal for said first external source, and having negligible electrical resistance,
      (c) a second conductor of minimum thermal conductance for providing a gate potential with negligible current drain for effecting cascode operation of said first and second transistors, connected between said cascode gate node of said M preamplifiers and a second terminal for a second external source of dc potentials (VGC), and
      (d) a third conductor of minimum thermal conductance for providing a gate potential with negligible current drain for operating said third transistors as loads, connected between said load gate node of said M preamplifiers and a third terminal for a third external source of dc potentials (VGL), and
      (e) a low ac impedance connected between said third terminal and said cold finger for eliminating crosstalk between said preamplifiers due to a signal induced voltage perturbations on said first conductor.

2. The combination set forth in claim 1 wherein, said low ac impedance consists of a capacitor presenting a low impedance to amplified IR detector signals.

3. The combination set forth in claim 1 wherein, said low ac impedance consists of a voltage source of low internal impedance.

4. The combination set forth in claim 1 wherein, each of said quantities M and N exceed one, and said sets of N IR detector elements are arranged in M parallel columns to form a two-dimensional array, each preamplifier being connected to the IR detector elements in a single column.

5. The combination set forth in claim 1 wherein, each of said quantities M and N exceed one, and said sets of N IR detector elements are arranged in successive line segments to form a linear array, each preamplifier being connected to the IR detector elements in a single line segment.

6. In an IR sensor having plural readout channels, the combination comprising
  (1) an evacuated cryogenic enclosure having an aperture for admission of IR image radiation through a predetermined aperture, and a cold radiation shield within said enclosure and spaced from the walls thereof,
  (2) a thermally and electrically conductive cold finger extending into said enclosure for conductively cooling and mechanically supporting said cold radiation shield,
  (3) a focal plane array installed within said cold radiation shield, mechanically supported by, electrically grounded to, and conductively cooled by said cold finger, including
    (a) an M×N plurality of IR detector elements for intercepting said IR image radiation within said aperture,
    (b) a multiple channel electrical readout circuit for sensing an electrical signal representing the IR image at each of (N×M) IR detector elements and grouping said sensed signals from sets of N IR detector elements into M separately scanned readout channels to facilitate a higher scanning rate and/or higher signal to noise ratio, and
    (c) M preamplifiers, one for each set of N IR detector elements, each preamplifier including four field effect transistors (T1-T4), each transistor having a gate and as principal electrodes, a source and drain;
      three field effect transistors (T1-T3) forming a cascoded amplifier having their principal electrodes connected in series between a ground node (VSS) and a drain node (VDD), both nodes being common to said M preamplifiers,
      the first transistor (T1), with source connected to said ground node (VSS), having the gate thereof connected to the set of N IR detector elements associated with that preamplifier,
      the second transistor (T2), with source connected to the drain of the first transistor, having the gate thereof connected to a cascode gate node common to said M preamplifiers,
      the third transistor (T3), with the source connected to the drain of the second transistor having the gate thereof connected to the drain thereof through an isolating resistance and to a load gate node common to said M preamplifiers,
      the fourth transistor (T4) forming a source follower, the source of which is connected via a current setting resistor to said ground node (VSS), the drain of which is connected to said drain node (VDD), and the gate of which is connected to the drain of the second transistor of the same preamplifier, and
    (d) a capacitor of low ac impedance connected between said load gate node and said cold finger,
  (4) electrical conductors of minimum number and cross sectional area entering said cryogenic enclosure for operating said focal plane array with minimum heat loss, comprising,
    (a) a first conductor for supplying the load current of said M preamplifiers, connected between said drain node and a first terminal for a first external source (VDD') of dc drain potential, and having substantial electrical resistance (RDD) to minimize thermal conductance,
    (b) said cold finger, which returns the load current of said M preamplifiers, being electrically connected between said ground node and an external ground terminal for said first external source, and having negligible electrical resistance, and
    (c) a second conductor of minimum thermal conductance for providing a gate potential with negligible current drain for effecting cascode operation of said first and second transistors, connected between said cascode gate node of said M preamplifiers and a second terminal for a second external source of dc potentials (VGC), said isolating resistance and said capacitor connected to said load gate node eliminating crosstalk between said preamplifiers due to a signal induced voltage perturbations on said first conductor.

7. The combination set forth in claim 6 wherein, each of said quantities M and N exceed one, and said sets of N IR detector elements are arranged in successive line segments to form a linear array, each preamplifier being connected to the IR detector elements in a single line segment.

* * * * *

UNITED STATES PATENT AND TRADEMARK OFFICE
CERTIFICATE OF CORRECTION

PATENT NO. : 4,862,002

DATED : August 29, 1989

INVENTOR(S) : Wang Samuel C. et al

It is certified that error appears in the above-identified patent and that said Letters Patent is hereby corrected as shown below:

On the title page Insert

- (73) Assignee: General Electric Company --.

Signed and Sealed this

Third Day of July, 1990

Attest:

HARRY F. MANBECK, JR.

*Attesting Officer*

*Commissioner of Patents and Trademarks*